(12) United States Patent
Fritsch et al.

(10) Patent No.: US 9,589,604 B1
(45) Date of Patent: Mar. 7, 2017

(54) SINGLE ENDED BITLINE CURRENT SENSE AMPLIFIER FOR SRAM APPLICATIONS

(71) Applicant: International Business Machines Corporation, Armonk, NY (US)

(72) Inventors: Alexander Fritsch, Esslingen (DE); Shankar Kalyanasundaram, Bangalore (IN); Michael Kugel, Boeblingen (DE); Juergen Pille, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/856,638

(22) Filed: Sep. 17, 2015

(51) Int. Cl.
| | |
|---|---|
| *G11C 7/06* | (2006.01) |
| *G11C 7/08* | (2006.01) |
| *G11C 11/4063* | (2006.01) |
| *G11C 11/413* | (2006.01) |
| *G11C 5/14* | (2006.01) |

(52) U.S. Cl.
CPC ............ *G11C 7/08* (2013.01); *G11C 5/147* (2013.01); *G11C 11/4063* (2013.01); *G11C 11/413* (2013.01)

(58) Field of Classification Search
CPC .. G11C 7/06; G11C 7/062; G11C 7/08; G11C 5/147; G11C 11/1673; G11C 11/2273; G11C 11/4063; G11C 11/413; G11C 13/004; G11C 16/26
USPC ......... 365/189.09, 185.21, 189.15, 205, 207, 365/154
See application file for complete search history.

(56) References Cited

U.S. PATENT DOCUMENTS

| | | | | |
|---|---|---|---|---|
| 5,247,479 | A | * 9/1993 | Young | G11C 7/062 327/52 |
| 5,815,452 | A | 9/1998 | Shen | |
| 6,009,032 | A | * 12/1999 | Lin | G11C 7/062 327/52 |
| 6,128,236 | A | * 10/2000 | Faue | G11C 7/062 365/205 |
| 6,212,108 | B1 | * 4/2001 | Akaogi | G11C 7/1048 365/189.09 |

(Continued)

OTHER PUBLICATIONS

Sil et al., "High Speed Single-Ended Pseudo Differential Current Sense Amplifier for SRAM Cell," International Symposium on Circuits and Systems (ISCAS 2008), May 18-21, 2008, Seattle, Washington, USA, ©2008 IEEE, pp. 3330-3333.

(Continued)

*Primary Examiner* — Tan T. Nguyen
(74) *Attorney, Agent, or Firm* — Samuel A. Waldbaum

(57) ABSTRACT

Single ended bitline current sense amplifier for SRAM applications. The present disclosure relates to current sense read amplifier for use as a read amplifier in a memory arrangement of memory cell groups, wherein in each of the memory cell groups cells includes at least one read port connected to a read amplifier by a bitline, and wherein said read amplifiers are connected to a data output. The current sense read amplifier includes a voltage regulator to keep a bitline voltage at a constant voltage level below a power supply voltage and above a ground, a measurement circuit to detect a high current value and a low current value in a input signal, and a generator to generate a high voltage level output signal when the high current value input is detected and to generate a low voltage level output signal when the low current level value is detected.

21 Claims, 8 Drawing Sheets

(56) References Cited

U.S. PATENT DOCUMENTS

| | | | |
|---|---|---|---|
| 6,243,314 B1 * | 6/2001 | Seol | G11C 7/065 365/185.21 |
| 6,262,598 B1 | 7/2001 | Cairns et al. | |
| 6,608,787 B1 * | 8/2003 | Daga | G11C 7/067 327/52 |
| 6,795,359 B1 * | 9/2004 | Baker | G11C 7/06 365/158 |
| 7,038,963 B2 * | 5/2006 | Lee | G11C 11/4091 365/189.09 |
| 7,272,062 B2 | 9/2007 | Taddeo | |
| 8,031,547 B2 | 10/2011 | Fort et al. | |
| 8,488,403 B2 | 7/2013 | Sachdev et al. | |
| 2002/0163825 A1 * | 11/2002 | Regev | G11C 7/062 365/49.17 |
| 2005/0078537 A1 * | 4/2005 | So | G11C 5/143 365/211 |
| 2006/0256619 A1 | 11/2006 | Daga et al. | |
| 2011/0069568 A1 | 3/2011 | Shin et al. | |

OTHER PUBLICATIONS

Dutt et al., "Current Mode Sense Amplifier for SRAM Memory," International Journal of Engineering Research & Technology (IJERT), vol. 1, Issue 3, May 2012, pp. 1-4.

Gayatri et al., "Efficient Current Mode Sense Amplifier for Low Power SRAM," International Journal of Computational Intelligence and Informatics, vol. 1, No. 2, Jul.-Sep. 2011, pp. 147-153.

Dwivedi, "Low Power CMOS Design of an SRAM Cell with Sense Amplifier," International Journal of Engineering and Advanced Technology (IJEAT), vol. 1, Issue 6, Feb. 2012, pp. 157-160.

Heselhaus, T. et al., "A Sensing Circuit for Single-Ended Read-Ports of SRAM Cells with Bit-Line Power Reduction and Access-Time Enhancement", Advances in Radio Science, Sep. 30, 2011, No. 9, pp. 247-253.

* cited by examiner

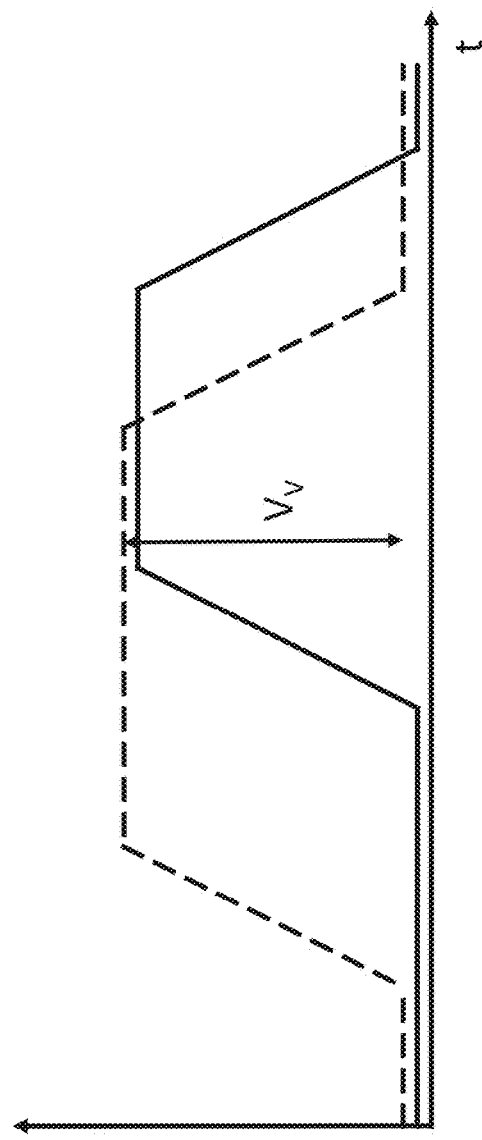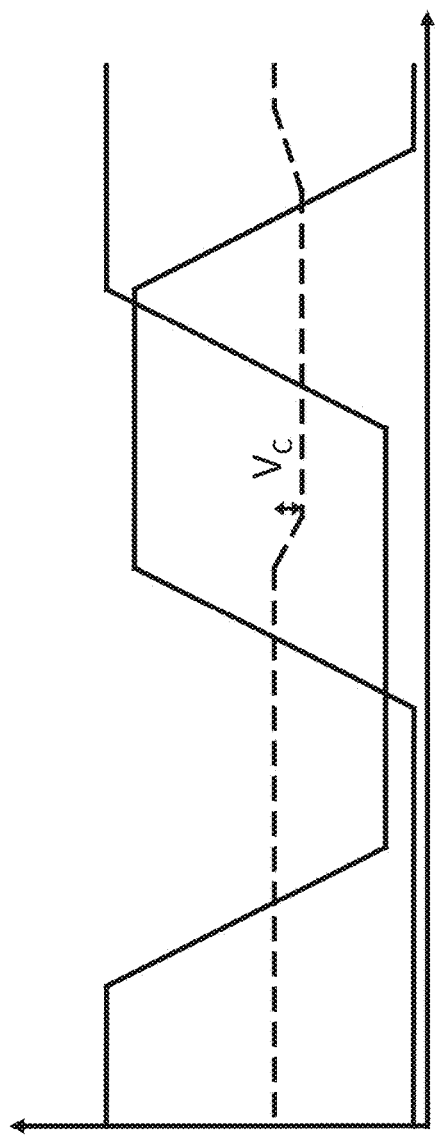

SINGLE ENDED BITLINE CURRENT SENSE AMPLIFIER FOR SRAM APPLICATIONS

BACKGROUND

The present invention relates generally to a current sense read amplifier, a memory circuit comprising the current sense read amplifier, and more particularly to a processor comprising the memory circuit and a method for amplifying a data signal on a bitline.

Integrated circuits are used for a diverse number of electronic applications, from simple devices such as wristwatches to the most complex computer systems. Low power circuits are becoming more prevalent due to a desire for lower power consumption. In particular, power dissipation has become a limiting factor for the yield of high performance circuit designs (operating at frequencies of one gigahertz and above) fabricated in deep sub micrometer technologies. Low power designs are also preferable, since they exhibit less power supply noise and provide better tolerance with regard to manufacturing variations. Furthermore, users ask for larger and faster memory, which increases the power consumption.

In a semiconductor memory device such as a dynamic random access memory (DRAM) or a static random access memory (SRAM), data read in a read operation sequentially passes through a plurality of sense amplifiers and is then output. Since a memory cell has a low signal drive capability, the data signal is amplified by a one or more bitline read amplifiers until it eventually reaches the memory output.

Recent trends have seen an increase in integration density of semiconductor memory devices and a reduction of a voltage thereof. An increase in the density results in an increase in the load capacitance across data lines reducing the read speed of the memory device.

To address this problem, US 2011/0069568 A1 proposes a semiconductor memory device that includes a plurality of memory cell array blocks, a bitline sense amplifier, a local sense amplifier that can be controlled to be turned on or off, a data sense amplifier, and a controller.

As technology advances and approaches the 14 nanometer semiconductor device fabrication node, further improvement in power consumption may be desirable.

BRIEF SUMMARY

Additional aspects and/or advantages will be set forth in part in the description which follows and, in part, will be apparent from the description, or may be learned by practice of the invention.

According to an aspect, the present invention relates to current sense read amplifier for use as a read amplifier in a memory arrangement of memory cell groups, wherein in each of the memory cell groups cells includes at least one read port connected to a read amplifier by a bitline, and wherein said read amplifiers are connected to a data output. The current sense read amplifier includes a voltage regulator to keep a bitline voltage at a constant voltage level below a power supply voltage and above a ground, a measurement circuit to detect a high current value and a low current value in a input signal, and a generator to generate a high voltage level output signal when the high current value input is detected and to generate a low voltage level output signal when the low current level value is detected.

An advantage of the exemplary embodiment allows for a reduction of voltage swings that occur on the bitline, thus the capacitance has a lower power consumption. Furthermore, the current corresponding to the content of a SRAM cell may be detected particularly fast by implementing the exemplary embodiment.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIGS. 5A and 5B show a comparison of a voltage reading scheme and a current reading scheme, respectively.

DETAILED DESCRIPTION

Figure 1:
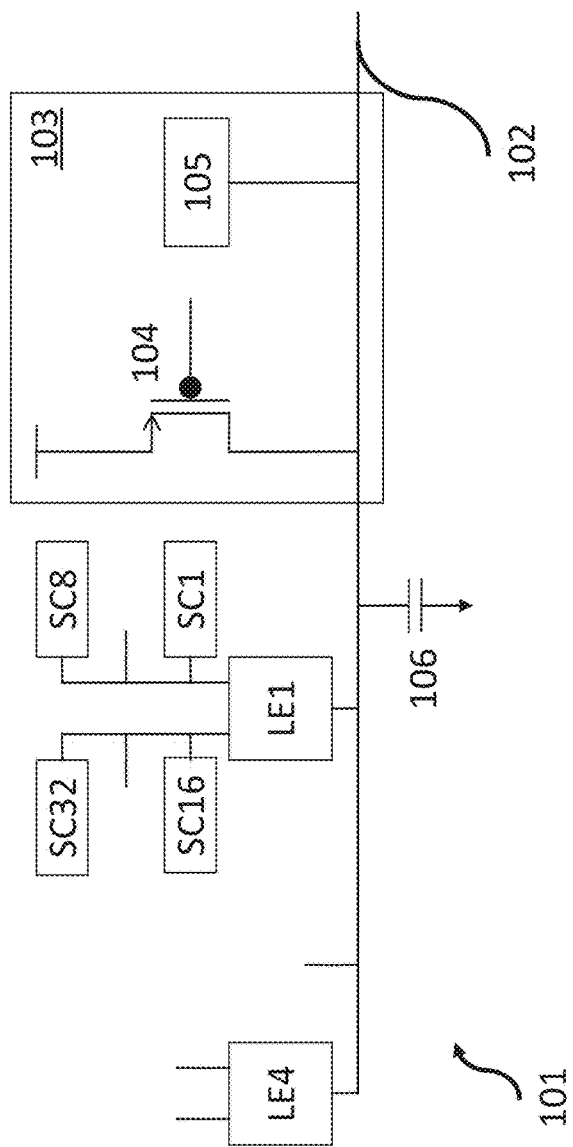
FIG. 1 shows a memory circuit using a voltage reading scheme.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Reference will now be made in detail to the embodiments of the present invention, examples of which are illustrated in the accompanying drawings, wherein like reference numerals refer to like elements throughout.

FIG. 1 shows a simplified electronic circuit 101, in particular a memory circuit, for reading the content of static random access memory (SRAM) cells being connected to a global bitline using a voltage reading scheme. A number of individual SRAM cells, a memory cell group, are connected via local read amplifiers to a global bitline 102. For example, thirty-two SRAM cells SC1 to SC32 may, via local bitlines, be connected to a first local read amplifier LE1, which itself is connected to the global bitline 102. In total four local read amplifiers LE1 to LE4 may be connected to the global bitline 102 such that four times thirty-two SRAM cells, for example, a memory arrangement of four memory cell groups each comprising thirty-two memory cells, are (indirectly) electrically coupled to the global bitline 102.

The electronic circuit comprises a precharge circuit 103 for precharging the global bitline 102. The precharge circuit 103 includes a field effect transistor (FET) 104 with its source connected to the supply voltage VDD and its drain connected to the global bitline 102. A precharge signal applied to the gate of the FET 104 may be used to precharge the global bitline 102 with essentially the supply voltage VDD. In the exemplary electronic circuit 101 of FIG. 1 the FET 104 is a PFET but an NFET with an inverted precharge signal may be also be used.

The precharge circuit 103 may further include a leakage compensation unit 105. The leakage compensation unit 105 may compensate small leakage currents. The leakage compensation unit 105 further keeps the global bitline 102 essentially at the voltage level VDD in case the global bitline 102 is not directly connected to VDD, i.e. when the field effect transistor 104 is not conducting. The global bitline 102 (and the local bitlines) may represent a substantial capacitance 106.

Figure 2:
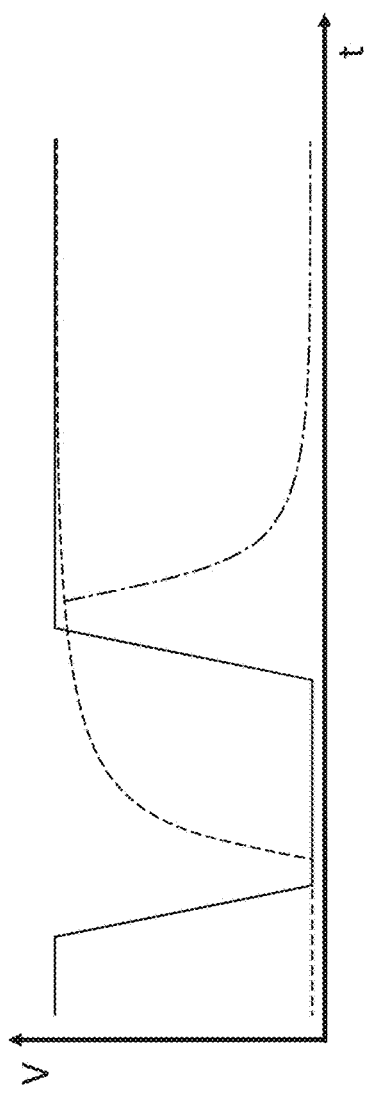
FIG. 2 shows the development of a global bitline voltage over time in a voltage sensing scheme.

FIG. 2 shows the development of a global bitline voltage V over time t (dashed lines). Before reading the content of the SRAM cells, the global bitline 102 is precharged by switching the precharge signal from high level to low level (continuous line). The global bitline 102 does not assume a high voltage level instantaneously but shows an articulated charging behavior of a capacitance. After precharging the global bitline 102, the precharge signal returns to high level and the content of the SRAM cells connected to the global bitline 102 is read. A global bitline returning to zero is indicative of a logic "1" stored the read SRAM cell(s) whereas a global bitline staying at essentially VDD corresponds to a logic "0" stored in the read SRAM cells.

Precharging the global and local bitlines 102 to essentially VDD may consume considerable power. Furthermore, coincident switching of many SRAM cores may generated huge transient current peaks.

Figure 3:
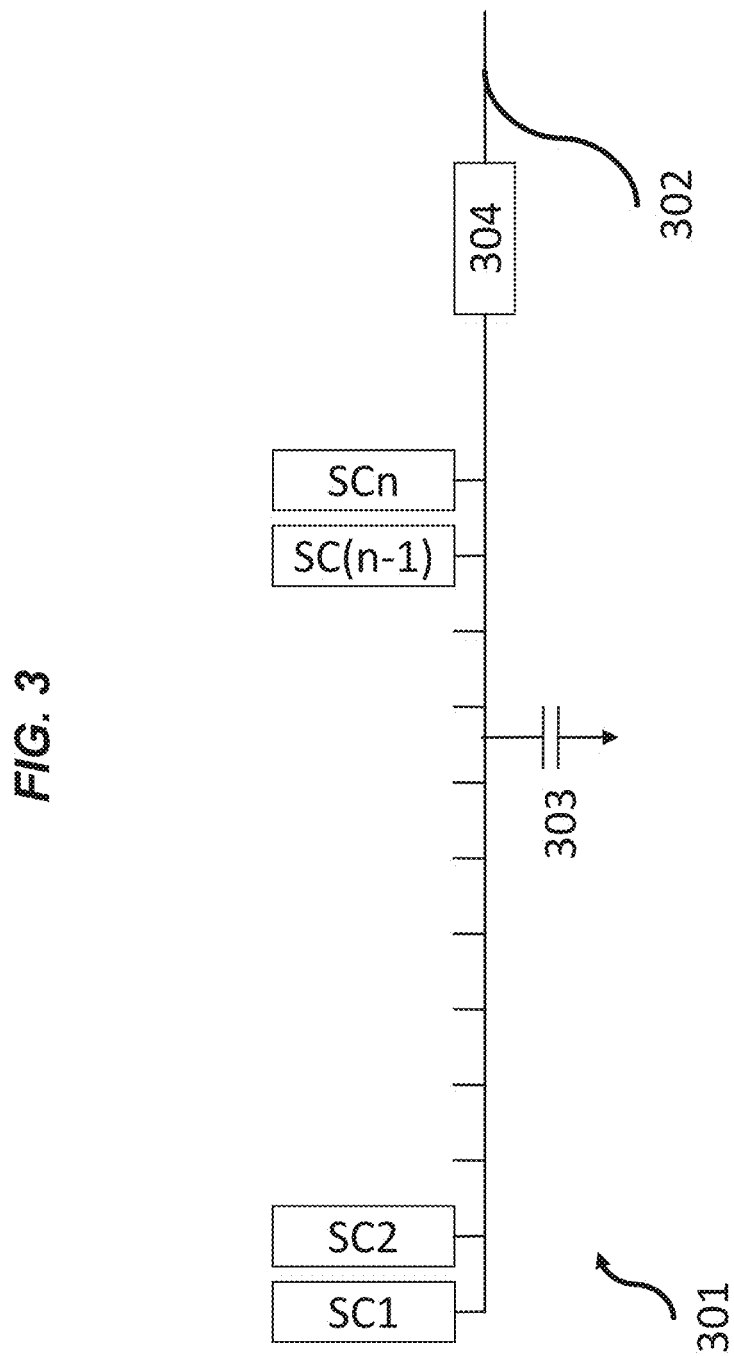
FIG. 3 shows a memory circuit using a current reading scheme.

FIG. 3 shows another electronic circuit 301 for reading the contents of SRAM cells SC1 to SCn using a current sensing scheme. The SRAM cells SC1 to SCn are connected to the bitline 302 without any local bitlines and/or local amplifiers interconnected.

A current sense read amplifier 304 is provided for detecting the current flowing in the bitline. Compared to the electronic circuit 101 shown in FIG. 1 the bitline hierarchy may be removed. Due to near constant bitline voltage level during sensing, the capacitance 303 of the bitline will not have a substantial influence on power consumption. Thus, the effective capacitance may be reduced compared to the electronic circuit 201 shown in FIG. 2 due to near constant bitline voltage level during sensing.

Figure 4:
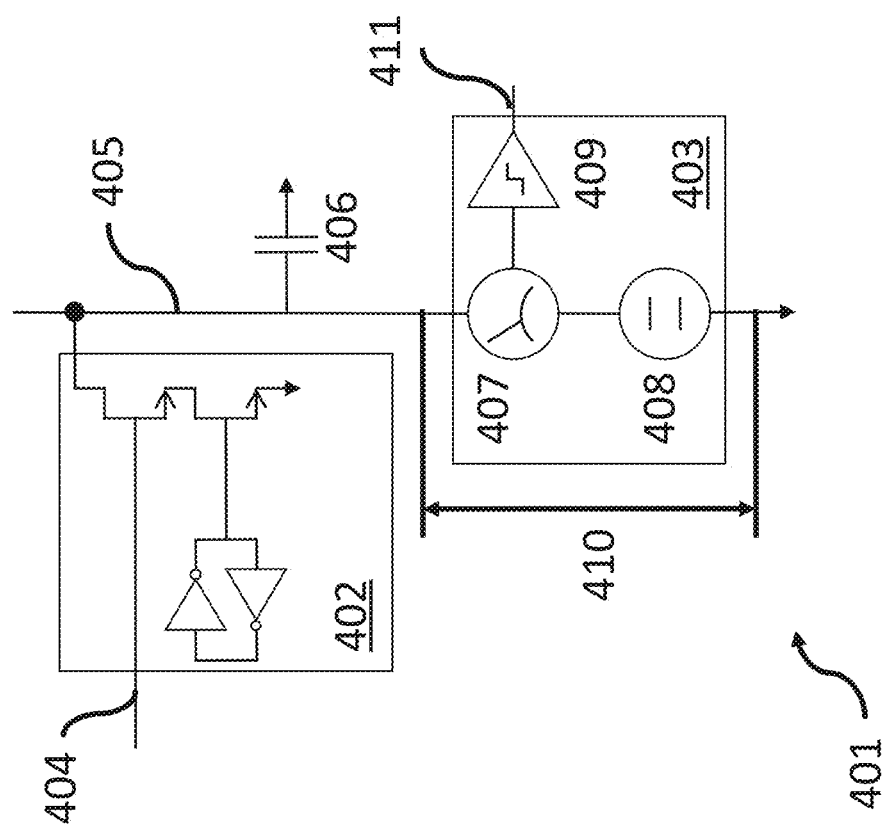
FIG. 4 shows a memory circuit using a current sense read amplifier.

In FIG. 4 an electronic circuit 401 for reading the content of an SRAM cell 402 using a current sense read amplifier 403. The SRAM cell 402 may be an 8 T-SRAM cell. An 8 T-SRAM cell is designed to consist of eight FETs. Two FET are used for each of the inverters of the SRAM cell 402 and two further FETs for reading the content of the SRAM cell 402. In particular, the content of the SRAM cell 402 may be read by applying a signal to the wordline 404. The transistors for writing the SRAM cell 402 are not shown in FIG. 4.

Although FIG. 4 relates to an 8 T-SRAM cell, the disclosure is not limited to 8 T-SRAM cells. In particular, essentially the same electronic circuit may be used for reading the content of 6 T-SRAM cells, too.

When the SRAM cell 402 is addressed via the wordline 404 the content of the SRAM cell 402 may be determined by the electric behavior of the bitline 405. If the bitline 405 is driven to a voltage above ground and the selected SRAM cell 402 stores a logical "1", a current will flow from the bitline 405 to ground via the two transistors for reading the content of the SRAM cell 402.

The current sense read amplifier 403 may comprise a voltage regulator in the form of a voltage source 408 for fixing the bitline voltage 410. Moreover, a measurement circuit can comprise, for example, a current detector 407 may be provided for detecting current flowing from the bitline 405 to ground. The current detector 407 of the measurement circuit, detects if the current of the input is a high current level input or a low current level input. A generator, for example, amplifier 409, outputs a high voltage level out signal or a low voltage level output signal based on the current input detected by the current detector 407 of the measurement circuit. The output of the current detector 407 may be amplified by an amplifier 409 and provided as a voltage signal 411.

As essentially no voltage swing occurs on the bitline 405, its capacitance 406 does not lead to substantial power consumption. Furthermore, the current corresponding to the content of the SRAM cell 402 may be detected particularly fast.

FIG. 5A shows the qualitative development of wordline voltage (dotted line), bitline voltage (dashed line) and output voltage (continuous line) for a current sensing scheme using, e.g., the electronic circuit shown in FIG. 4, (lower graph) in comparison to a voltage sensing scheme (upper graph) in case of an SRAM cell storing a logical "1".

As described above, using a voltage sensing scheme requires precharging. Accordingly, the bitline voltage rises to a voltage near VDD even before reading the contents of the SRAM cell by applying a wordline signal. Application of the wordline signal to an SRAM cell storing a logical "1" leads to decharging the bitline, which drops to ground level. Thus, every readout of an SRAM cell causes a substantial voltage swing VV on the bitline.

FIG. 5B shows a current sensing scheme, in which the bitline is maintained at an essentially constant voltage level, and no precharging is required. If a "1"-storing SRAM cell connected to the bitline is addressed by a respective wordline signal a current flows from the bitline to ground. This current is detected by a current detector and transmitted as an output voltage for further processing. The bitline, being held at an essentially constant voltage level, experiences only a minor voltage swing VC.

Furthermore, coincident precharging of several bitlines may leads to large peak currents. Large peak currents may lead to wire wear out over the lifetime of the electronic circuit. Moreover, large peak currents may require a high degree of decoupling to maintain the stability of the supply rails, in particular to maintain the voltage of the supply rails.

With a current sensing scheme, only signal current will flow and the peak currents may be reduced by more than 50 percent, more preferably by 65 percent.

Figure 6:
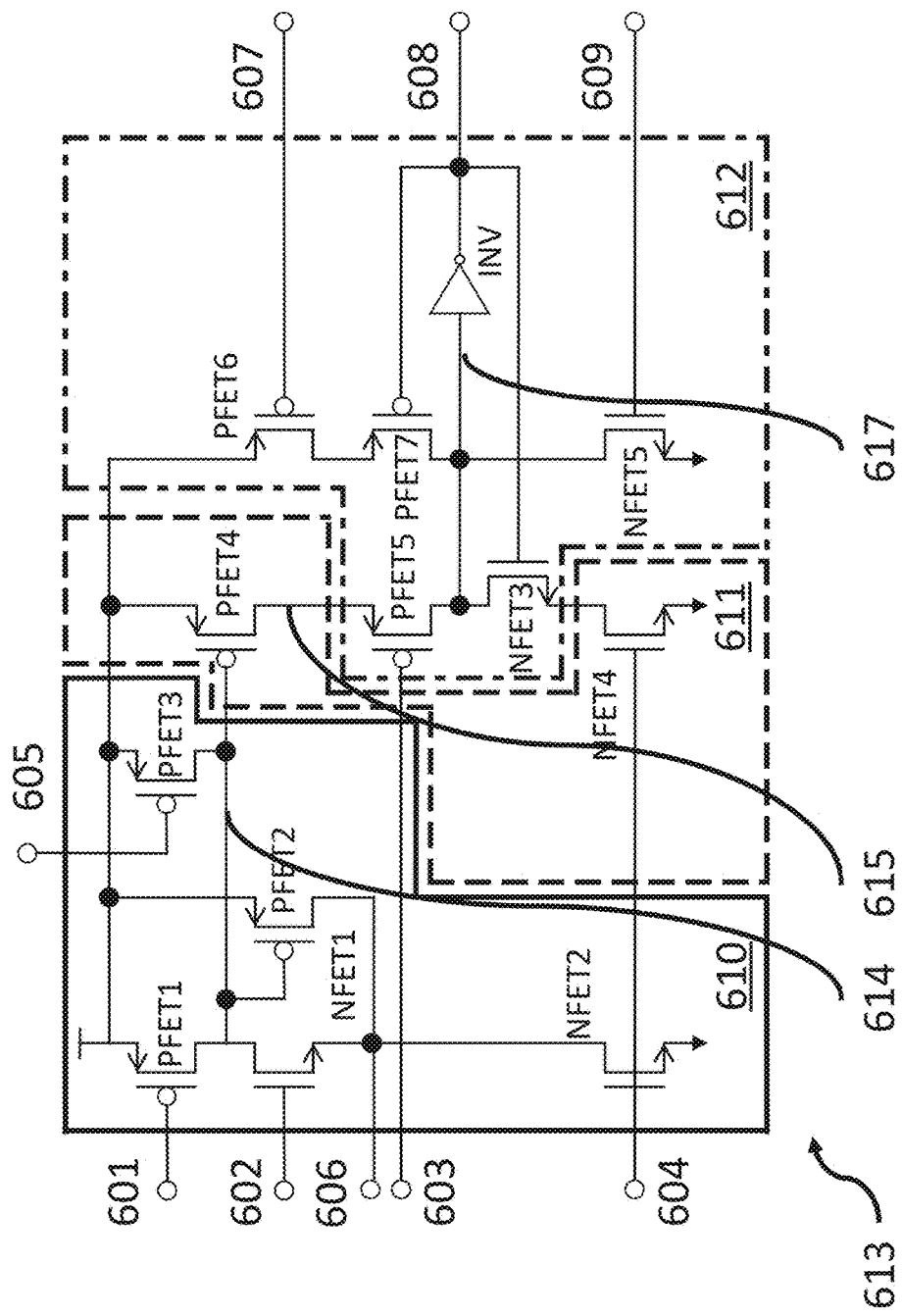
FIG. 6 shows a current sense read amplifier.

FIG. 6 shows a current sense read amplifier 613 in detail. The current sense read amplifier 613 comprises a current sensor 610 for setting the bitline voltage and sensing the current, a current-to-voltage converter 611 and an output latch 612 for storing the output value.

The current sense read amplifier 613 includes a first resetting circuit including, for example, a first reset input 605, and a second resetting circuit that includes, for example, a second reset input 607 and a third reset input 609, which may receive a respective reset signal for bringing the current sense read amplifier 613 to a defined state. The reset signal for the first reset input 605 may have to be provided as an inverted signal.

The bitline is connected to the input 606 of the current sensor 610. A first adjustment circuit may be provided to adjust the constant voltage level, for example, the bias voltage of the bitline voltage. For example, the input 602 of the transistor NFET1 may be used to adjust the bias voltage of the bitline voltage. Two further inputs 601 and 604 connected to transistors PFET1, NFET2 and NFET4 may be provided to determine the operating point of the current sensor 610 and the current-to-voltage converter 611. This allows compensating for a leakage current and the bias current required for adjusting the bias voltage of the bitline. Accordingly, the inputs 601 and 604 may be considered as second and third adjustment circuits to adjust the leakage current immunity and the operating point of the measurement circuit, for example, the current sensor 610, respectively.

If a read current flows through the bitline, which controls the gate of transistor PFET4, such that at point 615 the potential becomes VDD indicative of a logical "1" stored in the read SRAM cell(s).

The logical "1" is only transmitted to the output latch 612 if a signal is provided at the input 603 enabling the output latch 612. The input 603 of the output latch 612 may, for example, be activated with the same (or inverted) wordline signal for reading the SRAM cell. Accordingly, the input 603 may act as a configuration circuit to enable or disable the measurement circuit.

The logical "1" is stored in the output latch 612 and may be provided for further processing by the inverted output 608 of the latch. Accordingly, the output latch 612, for example, acts as a memory circuit and stores the output signal from the generator.

The read cycle may start with a high pulse on inputs 607 and 609 and a corresponding low pulse on input 605. The pulse will turn on NFET5 and turn off PFET6, initializing output 608 to VDD. The pulse on input 605 will turn on PFET3 and initialize the potential at 614 to VDD. After the reset phase, the input 603 switches from high to low to turn on PFET5. This enables current-to-voltage converter 611. The inverted wordline signal may be applied to the input 603 for this purpose.

NFET4 is a current sink and the input 604 defines the maximum current, which may flow through NFET4. If the SRAM cell content is "0", Iread, the current flowing into the SRAM cell (see FIG. 7), will be "0". Accordingly, the current through PFET4 will be "0" and NFET4 keeps the potential at 617 at ground. If the SRAM cell content is "1", the current through PFET2 will be larger than the maximum current through NFET2 and the voltage level at 617 will rise to VDD.

When the voltage at 617 reaches the switching threshold of the inverter INV, the positive feedback loop of the output latch 612 will be enabled. As the potential at 617 rises, output 608 will switch to ground, turning off NFET3 and turning on PFET7.

Eventually, the potential at 603 will switch back to high, turning off PFET5. The potential at 617 and at the output 608 will be latched until the next read cycle starts.

The current sense read amplifier according to FIG. 6 may enable multi read port designs (>=2) with 8 T SRAM cells, if additional read port transistors are added, and dual read port designs using 6 T SRAM cells. In particular, a dual read port design may be implemented with standard 6 T SRAM cells. Typically, both bitlines of a 6 T SRAM cells have to be evaluated with a differential voltage sense amplifier. With a current sense read amplifier according the present disclosure it may be possible to read the content of the 6 T SRAM cell by evaluating only one bitline. Accordingly, a dual read port design may be possible, wherein each bitline may be provided with an independent current read sense amplifier. The 6 T SRAM cell may be provided with two independent wordlines for the two current read sense amplifier. In particular, the dual read port design may allow for maintaining the operating frequency of the SRAM core. The operating frequency may be above 1 GHz, in particular above 3 GHz. For example, the SRAM core may be operated at 4 GHz.

Figure 7:
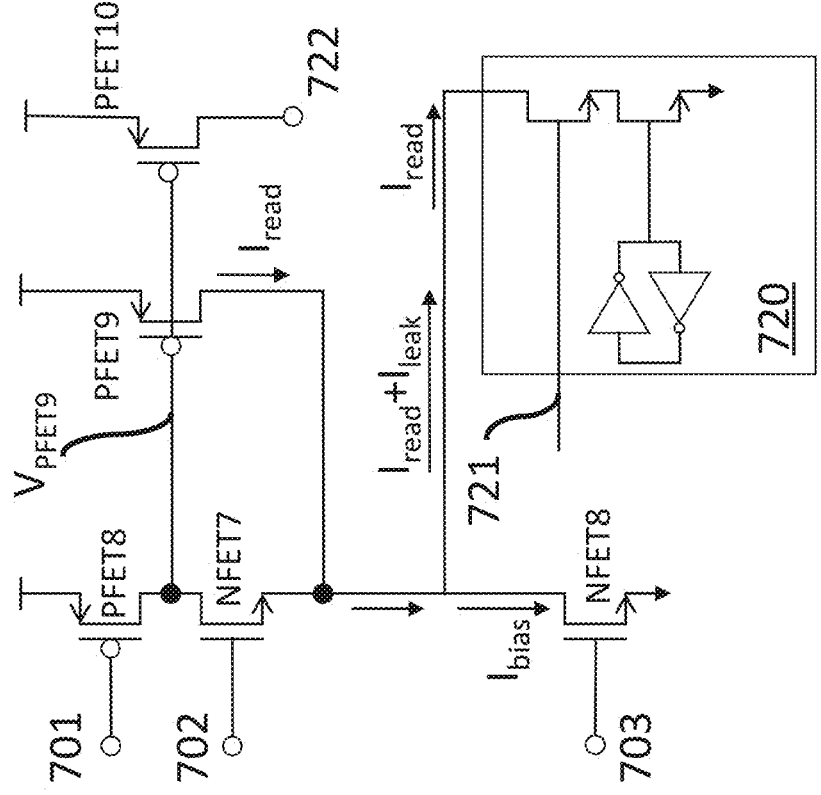
FIG. 7 shows a current sensor.

FIG. 7 shows a current sensor connected to a bitline. At least one SRAM cell 720 is connected to the bitline. A wordline 721 may be used to read the content of the SRAM cell 720. If the SRAM cell 720 stores a logical "1", a current Iread will flow from the bitline to ground through the read transistors of the SRAM cell 720. Inevitably, a leakage current Ileak will add to the Iread current.

In order to adjust the bitline bias voltage a current Ibias has to flow through the NFET7. Thus, the sensed current Isense will be the sum of Iread, Ileak and Ibias.

Inputs 701, 702, 703 are used to adjust the operating points of transistors PFET8, NFET7 and NFET8. This allows on the one hand for setting the bias voltage of the bitline. On the other hand, it may be ensured that only a current is transmitted via the output 722, if a current Iread flows through the read transistors of the SRAM cell 720. In particular, it may be avoided that a current Ileak is mistaken as current Iread.

PFET8 may work as a current source and the voltage at its input 701 may define the maximum current flowing through PFET8. NFET7 may work as a source follower. The input 702 of NFET7 may define the bias voltage of the bitline. The bitline is connected to the source of NFET7. NFET8 works as a current sink and the potential at 703 defines the small constant current Ibias. Ibias may serve to set VGS,NFET7 to a defined value. The current threshold of the current sense read amplifier may be set by input 701. If Isense is below IPFET9,max, the voltage VPFET9 will be near VDD. If Isense reaches Imax,PFET9 the voltage VPFET9 will drop and turn on PFET9, PFET9 will provide the current that is required to keep the bitline voltage at the bias voltage. The equilibrium current Iread is mirrored to PFET10. The drain of PFET10 is the current output of the current sensor provided at output 722.

Figure 8:
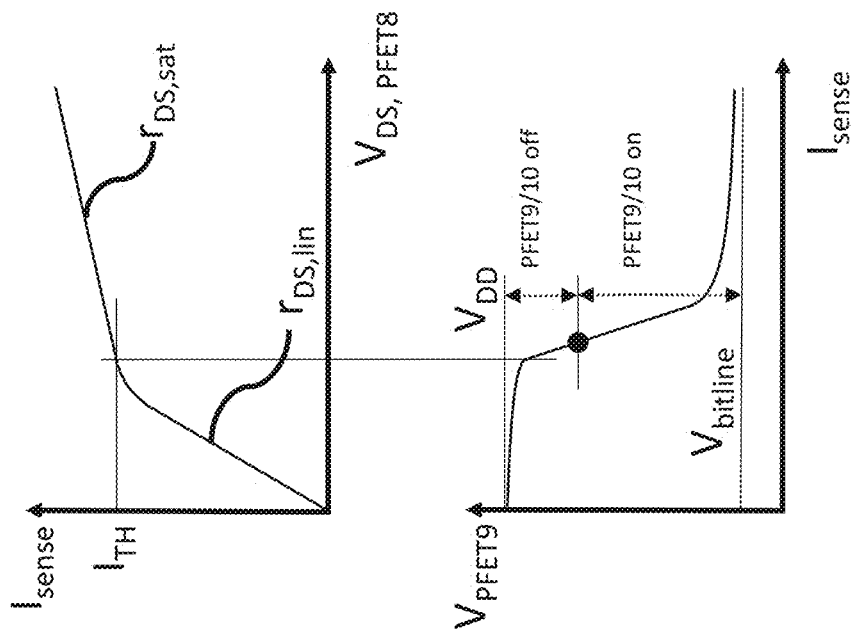
FIG. 8 shows characteristics of the current sensor of FIG. 7.

FIG. 8 shows in the upper diagram an example of the development of Isense in response to VDS,PFET8. The impedance switches from rDS,lin to rDS,sat when Isense exceeds ITH. ITH may be adjusted via VGS,PFET8, i.e., by applying a suitable voltage to input 701.

In the lower diagram VPFET9 is plotted against Isense. When (VDD-VPFET9) reaches VTH,PFET9 the transistor PFET9 and the transistor PFET10 are turned on and a current is provided at the output 722 indicative of a logical "1" stored in the SRAM cell.

Figure 9:
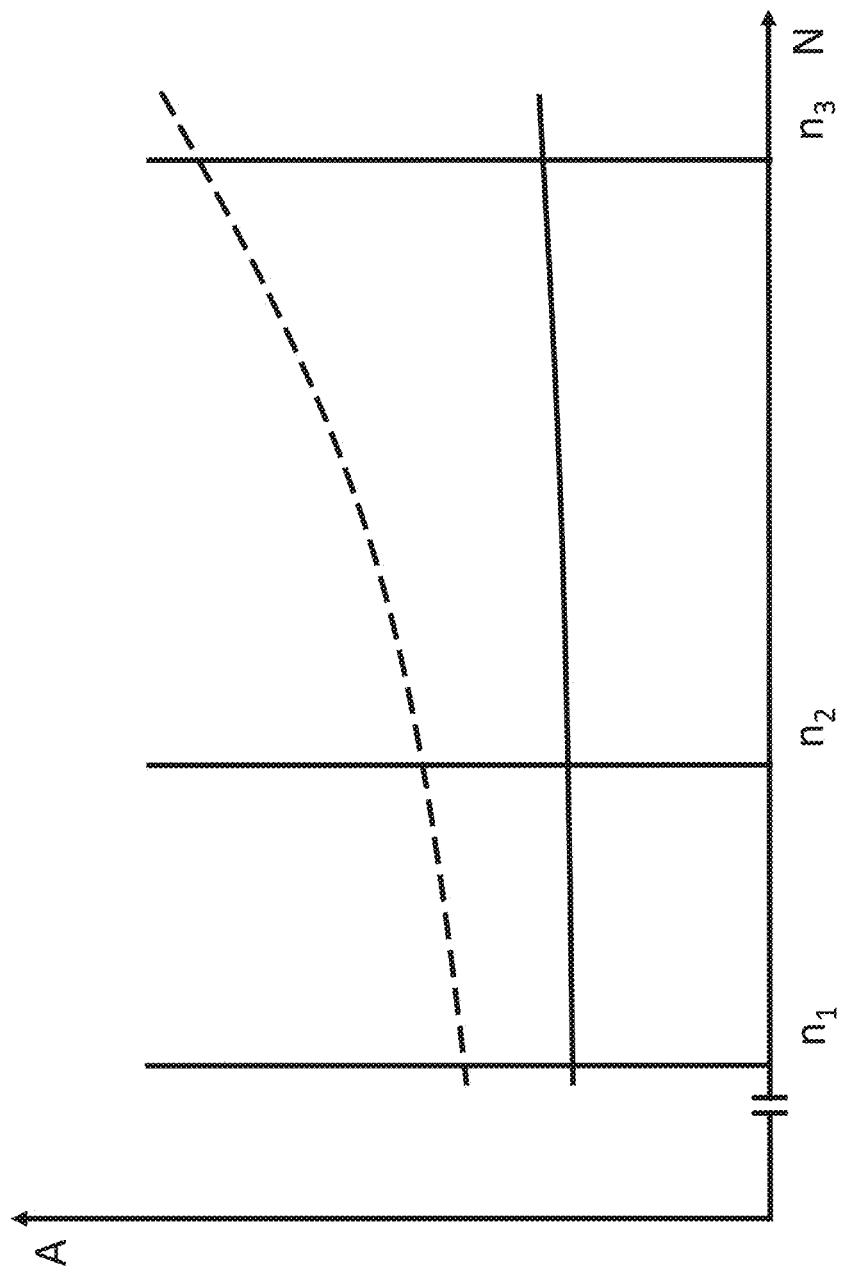
FIG. 9 shows average current consumption versus number of SRAM entries.

FIG. 9 shows the average current consumption A versus the number of SRAM entries for a voltage reading scheme (dashed line) and a current sensing reading scheme (continuous line), in accordance with one embodiment.

If the number of SRAM entries is n1=64 words the average current consumption may be reduced from above 40 µA to about 30 µA, i.e. by approximately 29 percent. If the number of SRAM entries is n2=128 words the average current consumption may be reduced from above 50 µA to slightly above 30 µA, i.e. by approximately 39 percent. If the number of SRAM entries is n3=256 words the average current consumption may be reduced from slightly below 70 µA to a little above 30 µA, i.e. by approximately 53 percent. The higher the number of SRAM entries the more the bitline read power may be reduced. The bitline power may be nearly independent from the size of the SRAM core. Accordingly, a current sensing scheme may be attractive for large, dense SRAM cores.

Figure 10:
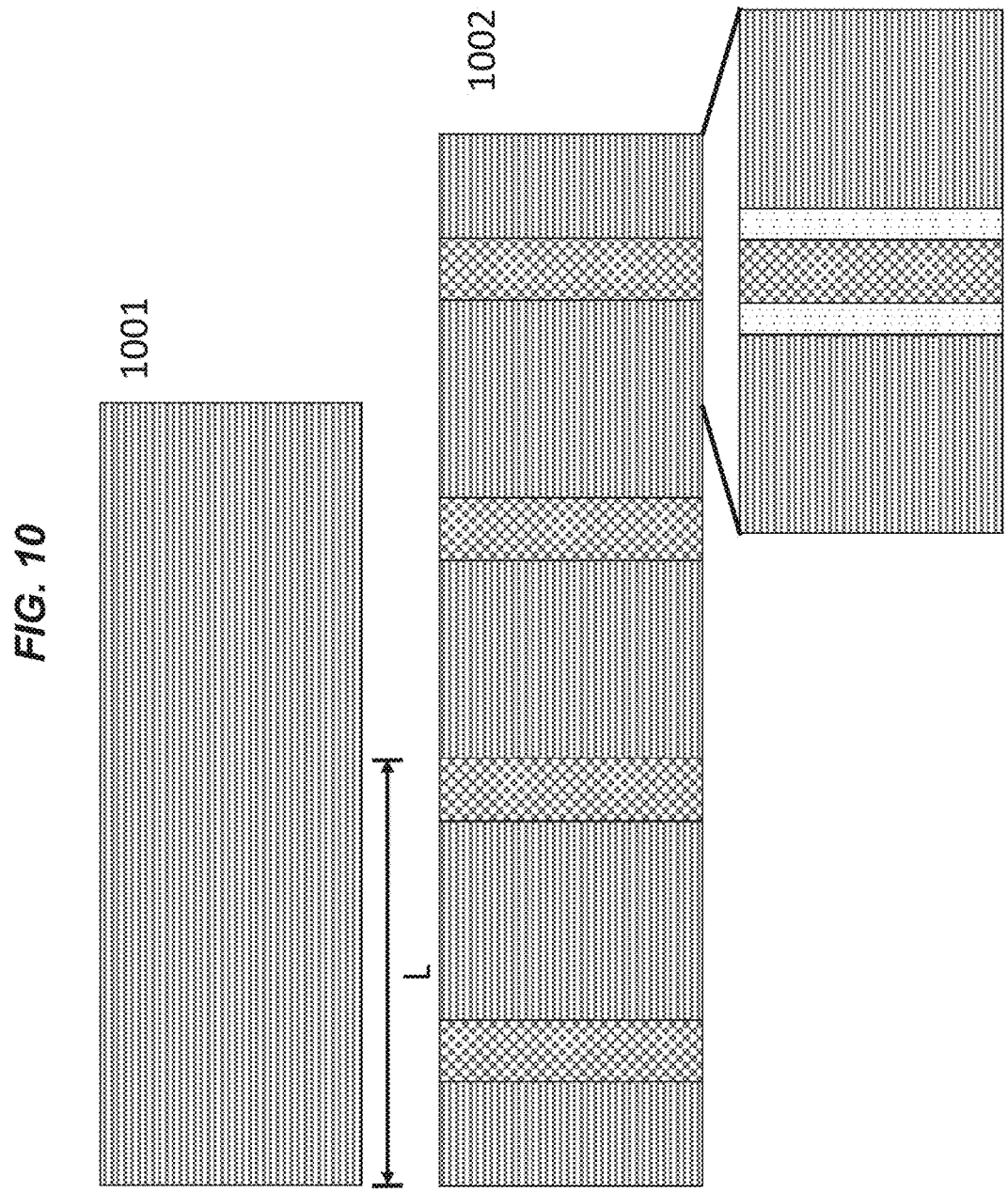
FIG. 10 illustrates substrate surface consumption.

In FIG. 10 the substrate surface required for an SRAM core using a current sensing read scheme (1001) is compared with an SRAM core using a hierarchical voltage sensing read scheme (1002). The dimension L may be, e.g., 10 µm. The individual SRAM cells of the SRAM core using may be arranged as one homogeneous, e.g. 128×4 bit, block of SRAM cells (horizontal lines) if a current sensing read scheme is provided. In case of a hierarchical voltage sensing read scheme (1002) is to applied, local read amplifiers (checkered board) may be required in the SRAM core area to ensure proper reading of the SRAM cells at the required performance. One local read amplifier may serve, e.g., 32 SRAM cells.

The implementation of local read amplifiers may have to respond to different layout rules than SRAM cells. For example, larger safety margins for exposition may be required. Accordingly, interface cells (lightly dotted) may be necessary at the interface between the SRAM cells and the local read amplifiers leading to additional surface consumption. Avoiding additional interface cells may improve the yield and/or the performance of the SRAM core.

Using a current sensing read scheme instead of a voltage sensing scheme may increase the SRAM cell density of an SRAM core, i.e. the number of SRAM cells on the substrate for a given surface unit, by more than 15 percent, preferably more than 20 percent, if the SRAM core is based on 8 T SRAM cells preferably more than 25 percent, preferably more than 30 percent, preferably more than 35 percent, if the SRAM core is based on 6 T SRAM cells.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the invention has been shown and described with reference to certain exemplary embodiments thereof, it will be understood by those skilled in the art that various changes in form and details may be made therein without departing from the spirit and scope of the present invention as defined by the appended claims and their equivalents.

What is claimed is:

1. Current sense read amplifier for use as a read amplifier in a memory arrangement of memory cell groups, wherein in each of said memory cell groups cells includes at least one read port connected to a read amplifier by a bitline, and wherein said read amplifiers are connected to a data output, the current sense read amplifier comprising:
   a voltage regulator coupled to the bitline to keep a bitline voltage at a constant voltage level below a power supply voltage and above a ground;
   a measurement coupled to the bitline circuit to detect a high current value and a low current value in a input signal;
   a configuration unit coupled to the measurement circuit to enable or disable the measurement circuit; and
   a generator coupled to the bitline to generate a high voltage level output signal when the high current value is detected and to generate a low voltage level output signal when the low current level value is detected.

2. The current sense read amplifier of claim 1, further comprising an adjustment circuit to adjust the constant voltage level.

3. The current sense read amplifier of claim 1, further comprising an adjustment circuit to adjust a leakage current immunity of the measurement circuit.

4. The current sense read amplifier of claim 1, further comprising an adjustment circuit to adjust an operating point of the measurement circuit.

5. The current sense read amplifier of claim 1, further comprising a resetting circuit for resetting the measurement circuit.

6. The current sense read amplifier of claim 1, further comprising a memory circuit to memorize the high voltage level output signal or to memorize the low voltage level output signal.

7. The current sense read amplifier of claim 6, further comprising a resetting circuit to reset the memory circuit.

8. A memory circuit comprising:
   at least one memory cell comprising at least one read port; and
   a current sense read amplifier;
   wherein the at least one memory cell is connected by the at least one read port to the current sense read amplifier, and
   wherein the current sense read amplifier comprises:
      a voltage regulator coupled to the bitline to keep the bitline voltage at a constant voltage level below a power supply voltage and above a ground;
      a measurement circuit coupled to the bitline to detect a high current value and a low current value in an input signal;
      a configuration unit coupled to the measurement circuit to enable or disable the measurement circuit; and
      a generator coupled to the bitline to generate a high voltage level output signal when the high current value is detected and to generate a low voltage level output signal when the low current value is detected.

9. The memory circuit of claim 8, wherein the current sense amplifier further comprises an adjustment circuit to adjust the constant voltage level.

10. The memory circuit of claim 8, wherein the current sense amplifier further comprises an adjustment circuit to adjust a leakage current immunity of the measurement circuit.

11. The memory circuit of claim 8, wherein the current sense amplifier further comprises an adjustment circuit to adjust an operating point of the measurement circuit.

12. The memory circuit of claim 8, wherein the current sense amplifier further comprises a resetting circuit to reset the measurement circuit.

13. The memory circuit of claim 8, wherein the current sense amplifier further comprises a memory circuit to memorize the high voltage level output signal or to memorize the low voltage level output signal.

14. The memory circuit of claim 13, wherein the current sense amplifier further comprises a reset circuit to reset the memory circuit.

15. The memory circuit of claim 14, wherein at least one the memory cell is a dynamic random access memory (DRAM) cell.

16. The memory circuit of claim 8, wherein the at least one memory cell is a static random access memory (SRAM) cell.

17. The memory circuit of claim 16, wherein the SRAM cell is 8 T SRAM cell.

18. The memory circuit of claim 16, wherein the SRAM cell is a 6 T SRAM cell.

19. Processor chip comprising:
   at least one processor core, and
   a memory circuit comprising:
      at least one memory cell comprising at least one read port, and
      a current sense read amplifier,
   wherein the at least one memory cell is connected by the at least one read port to the current sense read amplifier, and
   wherein the current sense read amplifier comprises:
      a voltage regulator coupled to the bitline to keep the bitline voltage at a constant voltage level below a power supply voltage and above a ground;
      a measurement circuit coupled to the bitline to detect a high current value or a low current value in an input signal;
      a configuration unit coupled to the measurement circuit to enable or disable the measurement circuit; and
      a generator coupled to the bitline to generate a high voltage level output signal when the high current value is detected and to generate a low voltage level output signal when the low current value is detected.

20. Processor chip according to claim 19, wherein the memory cell is an 8 T SRAM cell.

21. Processor chip according to claim 19, wherein the memory cell is a 6 T SRAM cell.

* * * * *